United States Patent
Kim et al.

(10) Patent No.: US 9,218,969 B2
(45) Date of Patent: Dec. 22, 2015

(54) METHOD FOR REDUCING INTERMIXING BETWEEN FILMS OF A PATTERNING PROCESS, PATTERNING PROCESS, AND DEVICE MANUFACTURED BY THE PATTERNING PROCESS

(75) Inventors: Kyoung Mi Kim, Anyang-si (KR); Jin Ha Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1034 days.

(21) Appl. No.: 13/246,012

(22) Filed: Sep. 27, 2011

(65) Prior Publication Data

US 2012/0139086 A1 Jun. 7, 2012

(30) Foreign Application Priority Data

Dec. 3, 2010 (KR) .................. 10-2010-0122407

(51) Int. Cl.
*H01L 21/027* (2006.01)
*H01L 21/033* (2006.01)
*H01L 21/311* (2006.01)
*G03F 7/40* (2006.01)
*G03F 7/039* (2006.01)

(52) U.S. Cl.
CPC ........ *H01L 21/0273* (2013.01); *H01L 21/0337* (2013.01); *H01L 21/31144* (2013.01); *G03F 7/0392* (2013.01); *G03F 7/40* (2013.01)

(58) Field of Classification Search
CPC ............ H01L 21/0273; H01L 21/0337; H01L 21/31144
USPC .......................................... 430/311, 313, 317
See application file for complete search history.

(56) References Cited

U.S. PATENT DOCUMENTS

| 6,469,197 B1 * | 10/2002 | Maeda et al. ................. 560/117 |
| 8,039,399 B2 * | 10/2011 | Niroomand et al. .......... 438/694 |
| 2009/0170034 A1 | 7/2009 | Lim |
| 2010/0055621 A1 | 3/2010 | Hatakeyama et al. |

FOREIGN PATENT DOCUMENTS

| JP | 2009139695 A | 6/2009 |
| JP | 2010085977 A | 4/2010 |
| KR | 100895406 B1 | 4/2009 |
| KR | 20100027995 A | 3/2010 |

* cited by examiner

*Primary Examiner* — Jose R Diaz
(74) *Attorney, Agent, or Firm* — Harness, Dickey & Pierce, P.L.C.

(57) ABSTRACT

An example embodiment relates to a patterning process including forming a photoresist pattern on a structure. The photoresist pattern includes a cross-linked surface that is insoluble in an organic solvent. The process also includes spin-on coating a dielectric layer on the photoresist pattern, partially removing the dielectric layer to form a plurality of dielectric spacers surrounding the photoresist pattern, and removing the photoresist pattern.

19 Claims, 9 Drawing Sheets

FIG. 4A (COMPARATIVE EXAMPLE)

METHOD FOR REDUCING INTERMIXING BETWEEN FILMS OF A PATTERNING PROCESS, PATTERNING PROCESS, AND DEVICE MANUFACTURED BY THE PATTERNING PROCESS

CROSS-REFERENCE TO RELATED APPLICATIONS

This application claims priority under 35 U.S.C. §119 to the benefit of Korean Patent Application No. 10-2010-0122407, filed on Dec. 3, 2010, in the Korean Intellectual Property Office, the entire contents of which is incorporated herein by reference.

BACKGROUND

1. Field

Some example embodiments of inventive concepts relate to a patterning process and more particularly a method for reducing intermixing between films of a double patterning technology (DPT) process. Some example embodiments relate to a semiconductor device manufactured by a patterning process, and more particularly to a semiconductor device manufactured by a double patterning technology (DPT) process.

2. Description of Related Art

With improvements in nano-scaling and integration of semiconductor devices, more patterns may be secured within a cell area in order to increase memory capacity. Accordingly, lithography processes are being developed to form minute patterns.

In lithography technology, photoresist may be applied to a semiconductor substrate, exposed to light of a desired wavelength through a patterned exposure mask, and developed to form the pattern. Controlling a critical dimension (CD) of a line width of a pattern is desired.

In the case of a pattern having a size of 1 μm or less, an exposure mask may be exposed to ultraviolet radiation through a reduction optical system while keeping a certain distance from the photoresist. There is interest in double patterning technology (DPT) to improve the resolution of the pattern formed on the photoresist.

In a spin-on side wall DPT process, the process includes forming a side wall spacer on a photoresist pattern.

SUMMARY

Some example embodiments relate to a method to reduce intermixing between films of a double patterning technology (DPT) process. Some example embodiments relate to a double patterning technology (DPT) process and a semiconductor device manufactured by the same. Other example embodiments relate to a patterning method.

According to an example embodiment of inventive concepts, a method to reduce intermixing between films of a double pattern technology (DPT) process includes: forming a photoresist pattern by forming a photoresist layer on a structure, the photoresist layer including a unit including a leaving group, performing a lithography process to pattern and cross-link a surface of the photoresist layer, spin-on coating an oxide layer on the photoresist pattern, and processing the oxide layer to form a plurality of oxide spacers around the photoresist pattern.

A double pattern technology (DPT) process may include the method. The oxide layer may include silicon oxide. The processing the oxide layer may include partially etching the oxide layer to form a plurality of oxide spacers. The process may further include removing the photoresist pattern to form an oxide spacer pattern. Further, the oxide spacer pattern may be on a semiconductor layer of the structure and the semiconductor layer may be on an oxide film of the structure. The process may further include forming a semiconductor pattern by etching the semiconductor layer using the oxide spacer pattern as a mask, and forming an oxide pattern by etching the oxide film using the semiconductor pattern as a mask.

A weight ratio of the unit including the leaving group may be 5 wt % to 20 wt % with respect to a total weight ratio of the photoresist layer.

The unit including the leaving group (—X) may include a R—NHC(O)X unit.

The leaving group (—X) may include a tertiary butyl group.

The forming the photoresist pattern may include heating and exposing the photoresist layer.

The heating may include removing the leaving group. The exposing may include de-blocking a protecting group of the photoresist layer. The forming the photoresist pattern may include cross-linking a surface of the photoresist layer.

The heating may include removing the leaving group X.

The exposing may include de-blocking a protecting group of the photoresist layer.

The heating may be performed within a temperature range from 140° C. to 190° C.

According to an example embodiment of the inventive concepts, a semiconductor device may be manufactured by the foregoing process.

According to an example embodiment of inventive concepts, a patterning process includes forming a photoresist pattern on a structure, the photoresist pattern including a cross-linked surface that is insoluble in an organic solvent. The process may include spin-on coating a dielectric layer on the photoresist pattern, and partially removing the dielectric layer to form a plurality of dielectric spacers surround the photoresist pattern. The process may include removing the photoresist pattern.

Forming the photoresist pattern may include coating a resin on the structure, exposing the resin, heating the resin, and removing a portion of the resin.

The resin may be represented by the following Chemical Formula 1

[Chemical Formula 1]

PG is a protecting group configured to de-block upon exposure to UV lithography, and X is a leaving group.

The leaving group may include a tertiary butyl group.

A unit including the leaving group X of the resin may be about 5 wt % to 20 wt % of a total weight of the resin.

The structure may include a substrate, a semiconductor layer on the substrate, and a BARC layer on the semiconductor layer. The forming the resist pattern may include patterning a resist layer on the BARC layer.

The partially removing the dielectric layer may include partially removing the BARC layer.

The process may further include etching the semiconductor layer after removing the photoresist pattern.

BRIEF DESCRIPTION OF THE DRAWINGS

The foregoing and other features and advantages of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their description will be omitted. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

First, a spin-on side wall double patterning technology (DPT) process, and an aspect of intermixing between films and its causes will be described. Then, a method for manufacturing a semiconductor device using a DPT process that reduces intermixing between films, according to an example embodiment, will be described.

Figure 1:
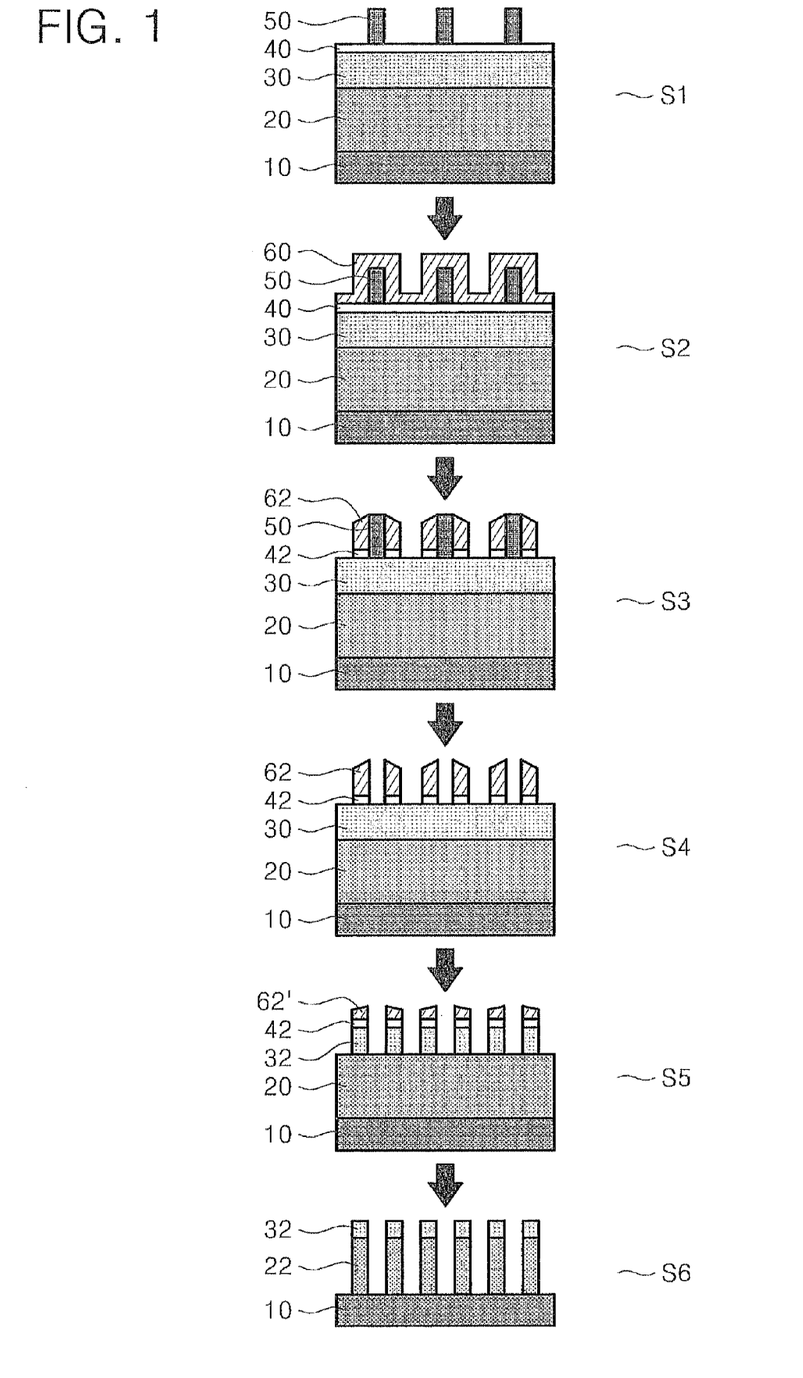
FIG. 1 is a lateral cross-section view sequentially illustrating a spin-on side wall process according to an example embodiment of the inventive concepts.
Figure 2:
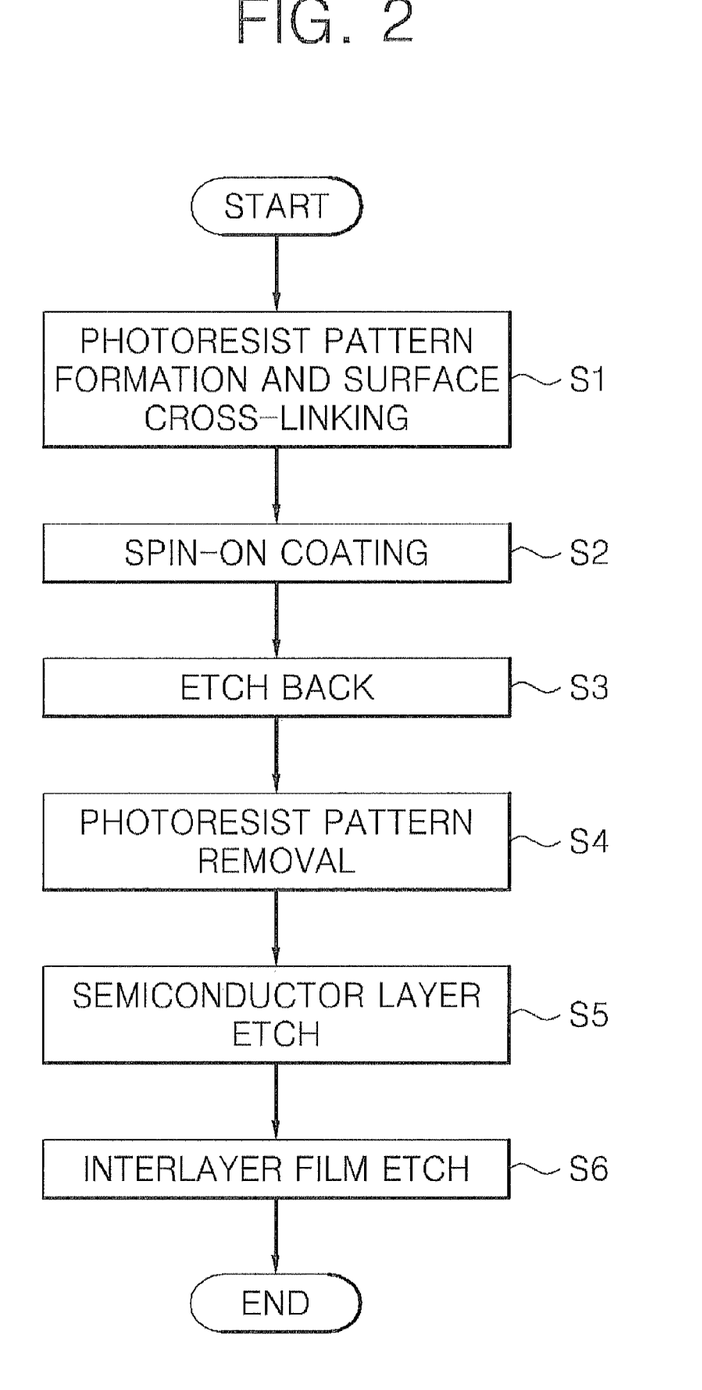
FIG. 2 is a flowchart sequentially showing the process of FIG. 1.
Figure 3:
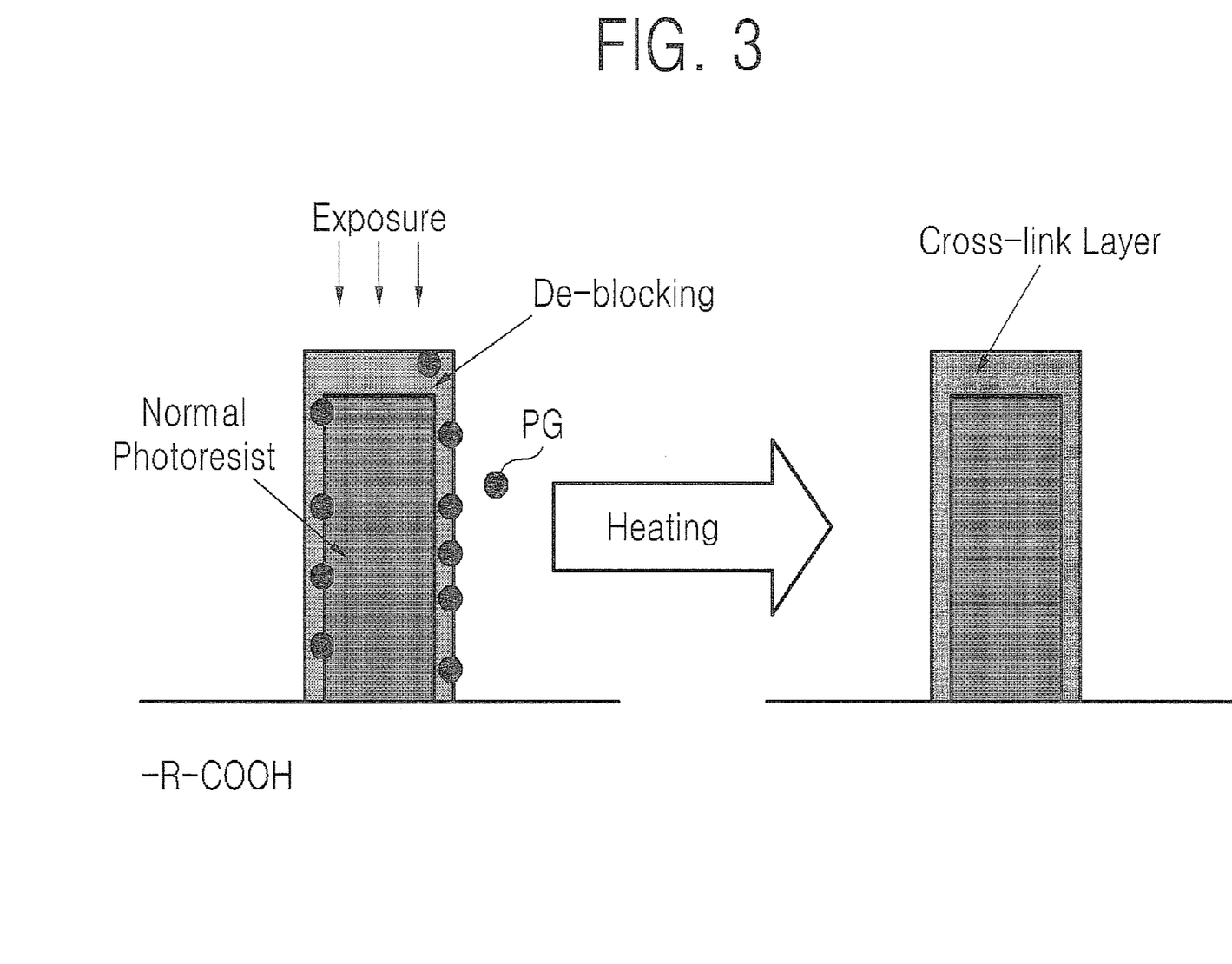
FIG. 3 schematically illustrates a cross-linking reaction on a surface of a photoresist pattern according to an example embodiment of the inventive concepts.

FIG. 1 is a lateral cross-section view sequentially illustrating a spin-on side wall process according to an example embodiment of the inventive concepts. FIG. 2 is a flowchart sequentially showing the process of FIG. 1. FIG. 3 illustrates a cross-linking reaction on a surface of a photoresist pattern according to an example embodiment of the inventive concepts.

Referring to FIGS. 1 to 3, a spin-on side wall process includes a first stage of forming a photoresist pattern 50 (S1) on a structure.

At this time, a structure including the photoresist pattern 50 formed thereon may be a semiconductor device including a substrate 10, a interlayer 20, a semiconductor layer 30, a bottom anti-reflective coating (BARC) layer 40, and the photoresist pattern 50 are stacked in sequence.

Here, the substrate 10 may be a semiconductor wafer, such as a silicon wafer and/or a silicon wafer cut of single crystal silicon, but example embodiments are not limited thereto. Other substrate materials, for example gallium arsenide, silicon on insulator, multi-crystalline silicon, silicon germanium, and the like may be used instead of a single crystal silicon wafer according to some example embodiments of the inventive concepts.

The interlayer 20 is formed on the substrate 10. The interlayer 20 may be an insulator, for example an oxide such as a silicon oxide ($SiO_2$) film formed by reacting a surface of the substrate 10 with oxygen ($O_2$) at high temperature of about 800° C. to 1200° C., but example embodiments are not limited to silicon oxide as the interlayer 20 material The interlayer 20 is a layer where a interlayer pattern 22' is finally formed by a double pattern based on the spin-on side wall process of the inventive concepts.

The semiconductor layer 30 is formed on the interlayer 20, and serves to protect the top of the interlayer 20. According some example embodiments of the inventive concepts, the semiconductor layer 30 may include poly-silicon and/or doped silicon, silicon germanium, but example embodiments are not limited thereto.

The BARC layer 40 includes an anti-reflective film formed on the semiconductor layer 30, which is provided on an object substrate to be formed with a pattern before coating photoresist. The BARC layer 40 can reduce reflection of light from the bottom during an exposure process. In some example embodiments, the BARC layer may be omitted.

The photoresist pattern 50 is formed to have a desired (or alternatively predetermined) pattern through a lithography process after forming a photoresist layer on the semiconductor layer 30 or the BARC layer 40. The lithography process complies with a typical method used in semiconductor production, and thus detailed descriptions thereof will be avoided.

A photoresist resin according to an example embodiment of inventive concepts includes a resin compound that contains a unit including a leaving group. The resin compound may be argon fluoride (ArF) photosensitive resin. Argon fluoride (ArF) may radiate vacuum ultraviolet of 193 nm so as to form a circuit pattern including a line width of about 0.07 micron.

A photoresist resin compound including a unit having the leaving group (—X), according to an example embodiment of the inventive concepts, is represented by the following chemical formula 1.

[Chemical formula 1]

As shown in the Chemical Formula 1, the resin includes a unit having the leaving group R—NHC(O)X. At this time, the leaving group (—X) may be a thermal labile functional group such as a tertiary butyl group. The unit of resin having the leaving group may be included by a weight ratio of 5 wt % to 20 wt % with respect to the total weight of the whole photoresist resin compound.

As shown in FIG. 3, the surface of the photoresist pattern 50 is exposed and includes a carboxyl group (R—COOH) included in the general argon fluoride photosensitive resin. The protecting group (PG) existing on the surface is de-blocked by exposure, thereby leaving a carboxyl group (R—COOH). The photoresist pattern is heated so that the leaving group can be removed, thereby causing a cross-linking reaction on the surface of the photoresist pattern. At this time, the heating may be achieved at a temperature of 140° C. to 190° C.

The mechanism of the cross-linking reaction can be represented by the following mechanism.

[Cross-linking Mechanism]

The cross-linked surface of the photoresist pattern 50 is insoluble (and/or substantially insoluble) in an organic solvent. Accordingly, it is possible to reduce intermixing with a material to be coated in the following stage.

In a second stage S2, a dielectric layer 60 is spin-on coated onto the photoresist pattern 50 formed in the first stage.

According to an example embodiment of the inventive concepts, the dielectric layer 60 may be an oxide and/or silicon oxide. The dielectric layer 60 may be applied, as liquefied oxide $SiO_2$ is dropped on the photoresist pattern 50 formed in the first stage, and the wafer is rotated at high speed, thereby forming an oxide layer as a uniformly thin film.

Next, the dielectric layer 60 coated as the uniformly thin film is baked and developed to correspond to a pattern shape, thereby completing the dielectric layer 60 as shown therein. In other words, the dielectric layer 60 forms a spacer on a lateral side as well as the top of the photoresist pattern 50.

In a third stage S3, the dielectric layer 60 formed in the second stage is etched back.

Specifically, as shown therein, the dielectric layer 60 between the patterns is partially removed by etching on the BARC layer 40 and the top of the photoresist pattern 50. At this time, the BARC layer 40 formed in the bottom layer and formed on the bottom of the pattern is also etched, and thus the semiconductor layer 30 is exposed between the patterns.

In a fourth stage S4, the photoresist pattern 50 is removed. Removing the photoresist pattern may be done using a solvent and/or ashing process, but example embodiments are not limited thereto.

At this time, the solvent or the ashing is possible through the top of the photoresist pattern 50 exposed as dielectric layer 60 etched back in the third stage, and it is thus possible to form an dielectric spacer pattern 62 as a micro pattern forming a side wall of the photoresist pattern 50. Here, the BARC layer 40 placed beneath the photoresist pattern 50 is removed together, so that the semiconductor layer 30 can be exposed between the dielectric spacer patterns 62.

As described above, the surface of the photoresist pattern 50 is cross-linked in the first stage, and thus the intermixing with the dielectric layer 60 is minimized, so that the solvent-removed or ashed part of the photoresist pattern 50 can have a width nearly equal to the width of the photoresist pattern 50 formed in the first stage.

In a fifth stage S5, the semiconductor layer 30 is etched. At this time, the semiconductor layer 30 is etched using the oxide spacer pattern 62 formed in the fourth stage as a mask, thereby forming a semiconductor pattern 32.

In a sixth stage S6, the interlayer 20 is etched. Likewise, the interlayer 20 is etched using the semiconductor pattern 32 formed in the fifth stage as a mask, thereby forming the silicon oxide pattern 22 finally.

Next, experimental examples are discussed.

COMPARATIVE EXAMPLE 1

The Comparative example 1 is related to an aspect of intermixing when the spin-on side wall process is performed using the photoresist pattern not cross-linked. Here, the sequence and method of the spin-on side wall process are the same as those of an example embodiment of the inventive concepts illustrated in FIG. 1, except that there was no cross-linking reaction on the surface of the photoresist pattern. Experimental example 1 includes a silicon substrate (10), a silicon oxide interlayer (20), a poly-silicon semiconductor layer (30), a barc layer (40), and silicon oxide dielectric layer (60).

Figure 4A:
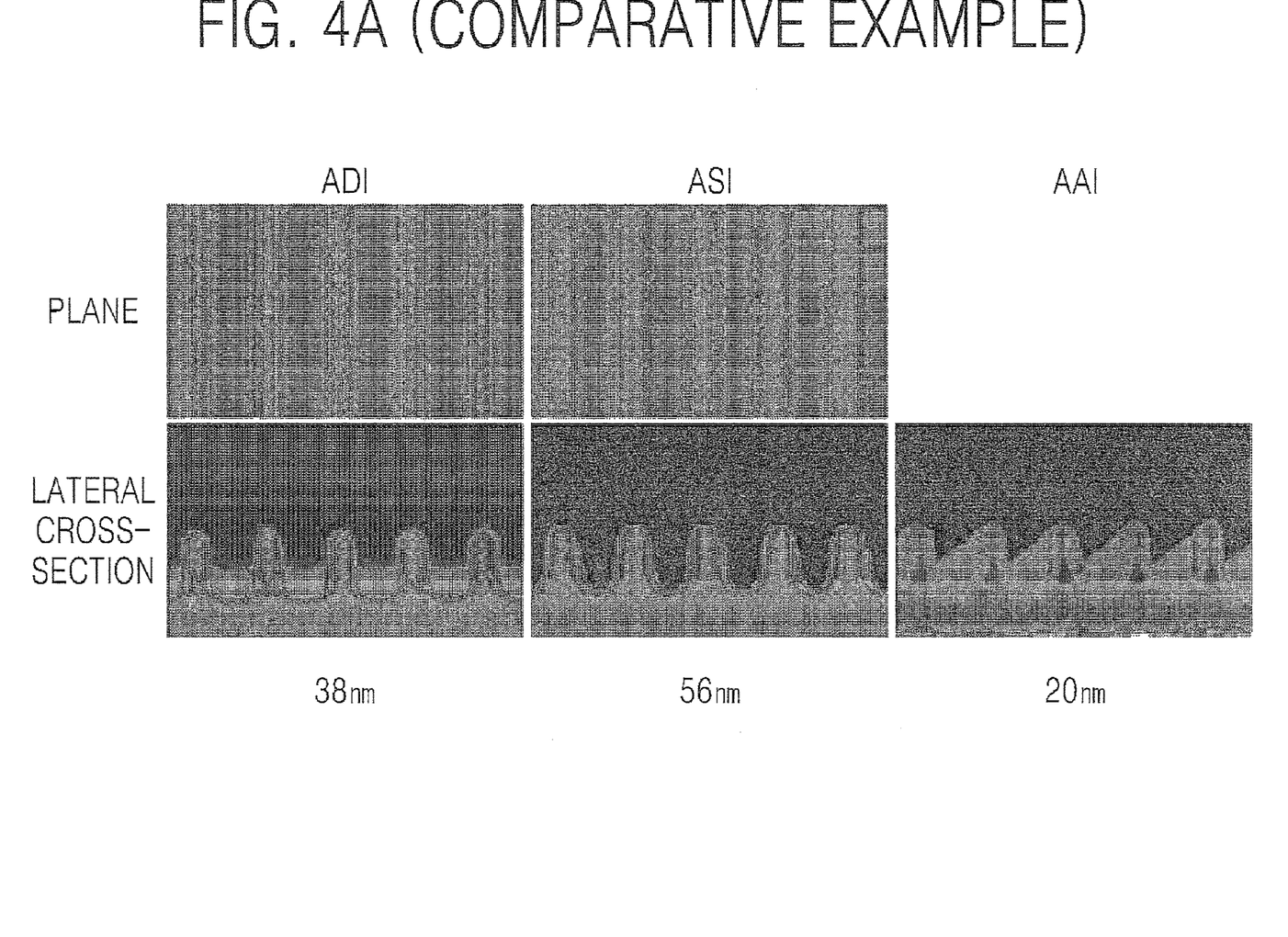
FIG. 4A shows a scanning electron microscope (SEM) pattern image in stages of a process according to an example embodiment of the inventive concepts.
Figure 4B:
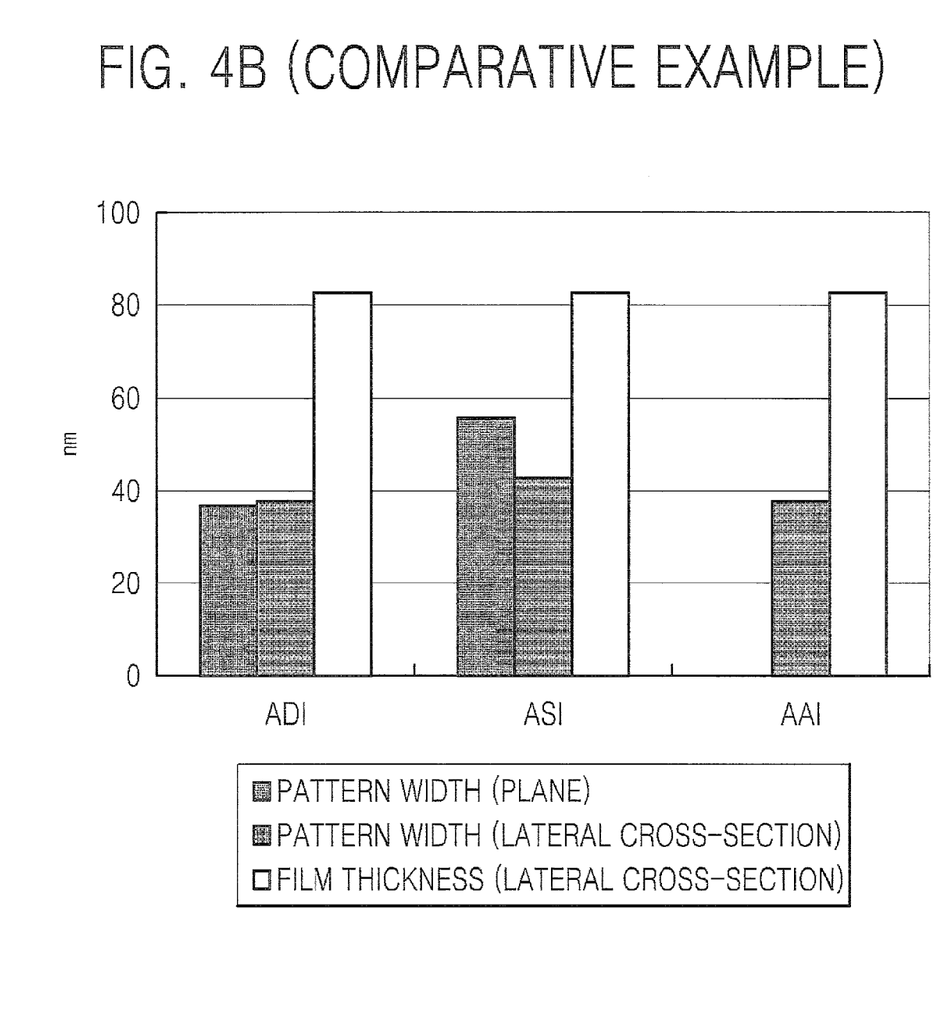
FIG. 4B is a graph showing change in a pattern width W in accordance with FIG. 4A.

FIG. 4A shows a scanning electron microscope (SEM) pattern image in each stage of the process, and FIG. 4B is a graph showing change in a pattern width W in accordance with FIG. 4A.

Here, ADI, ASI and AAI show pattern images in the respective stages of the process. Specifically, ADI is a SEM image after forming the photoresist pattern through the exposure and the development; ASI is a SEM image after spin-on coating, baking and developing silicon oxide; and AAI is a SEM image after etching back the spin-on coated oxide layer, and removing by solvent or ashing the photoresist pattern exposed between oxide side walls.

ADI showed a pattern width of 38 nm, ASI shows a pattern width of 56 nm, and AAI shows a pattern width of 20 nm. A result from analyzing these notes that the pattern increased at opposite lateral sides of the photoresist pattern has a width of 18 nm as the oxide of ASI is spin-on coated on the photoresist pattern of ADI, and the pattern increased at each of the opposite lateral sides of the photoresist pattern has a width of 9 nm. However, the pattern had a width of 20 nm after the photoresist pattern is removed by solvent or ashed in AAI, and this showed that there was intermixing by a difference of 11 nm at the opposite lateral sides of the photoresist.

The intermixing is caused as the photoresist of an organic matter is dissolved in ether of a solvent for oxide when oxide is spin-on coated on the photoresist pattern.

The following experimental examples 1 to 3 are related to what conditions in the process have an effect on the amount of intermixing between the films.

EXPERIMENTAL EXAMPLE 1

The experimental example 1 is related to a relationship between the amount of intermixing and a neglected time after the coating in association with the spin-on coating of oxide.

Figure 5A:
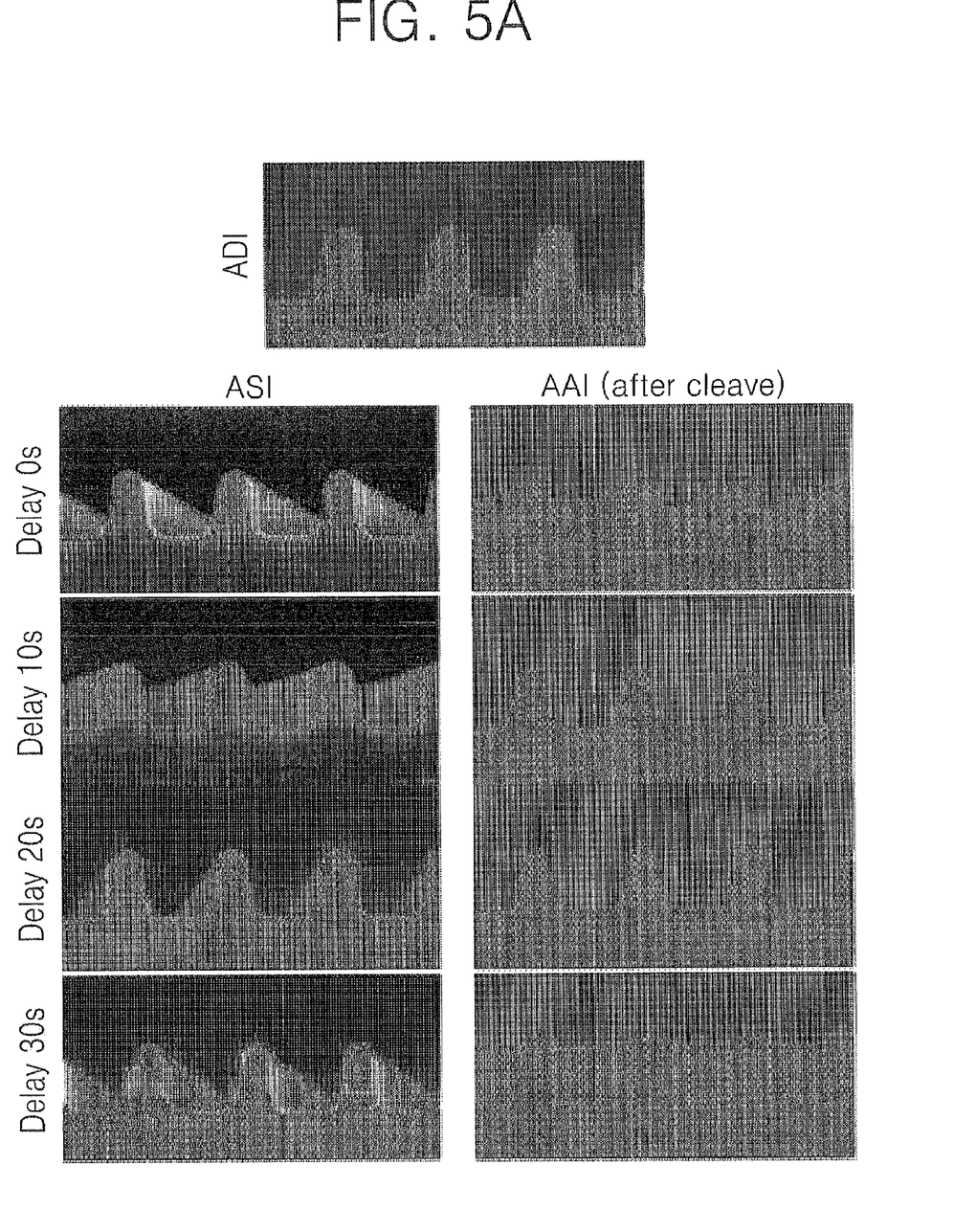
FIG. 5A is a lateral cross-section SEM image of a semiconductor device showing relationship between the amount of intermixing and a neglected time after coating based on a experimental example 2.
Figure 5B:
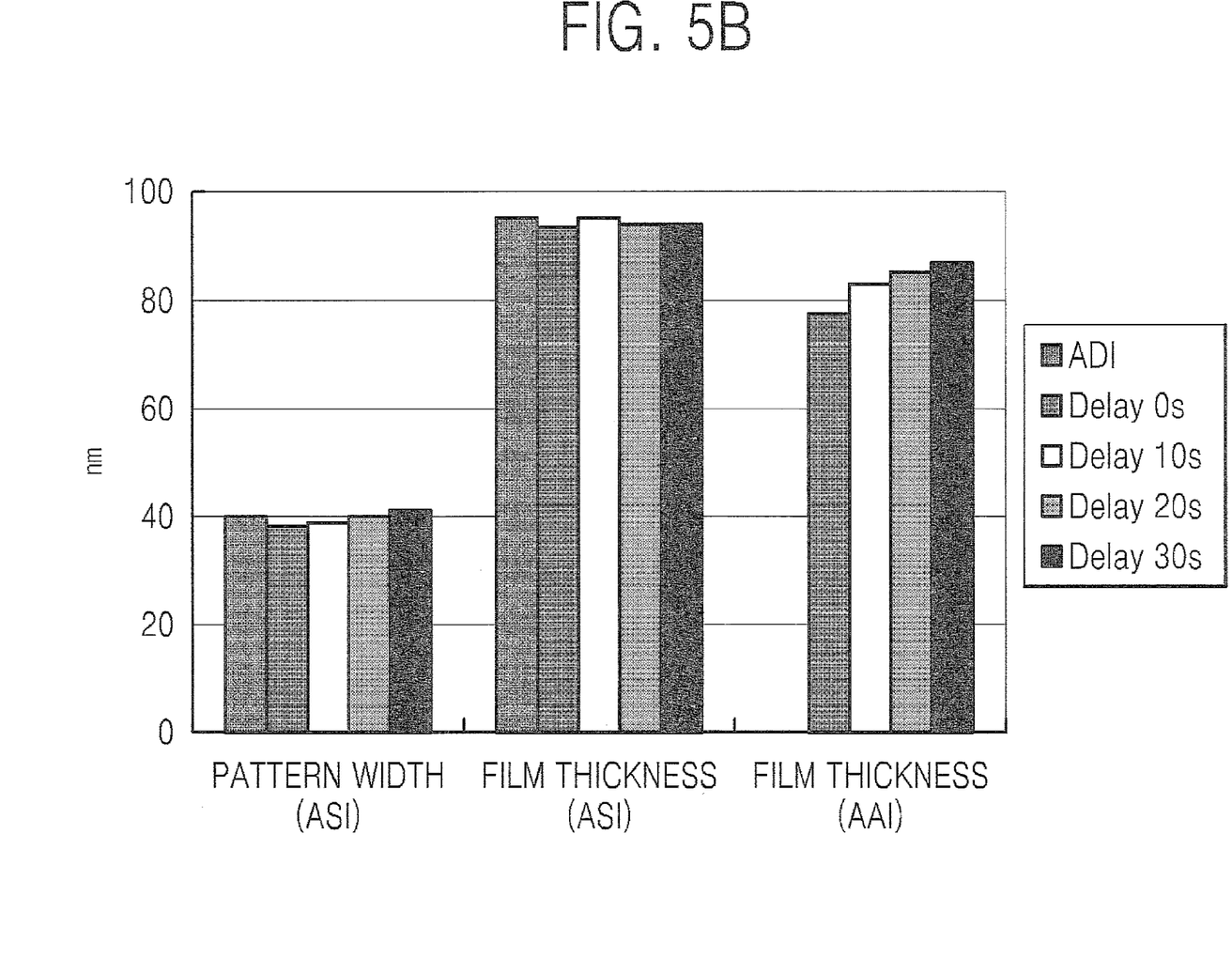
FIG. 5B is a graph showing a result in accordance with FIG. 5A.

FIG. 5A is a lateral cross-section SEM image of a semiconductor device showing relationship between the amount of intermixing and a neglected time after coating based on a experimental example 1, and FIG. 5B is a graph showing a result in accordance with FIG. 5A.

Referring to FIGS. 5A and 5B, oxide was spin-on coated on the photoresist pattern and neglected as it is not baked, and then the amount of intermixing was observed as time goes by. Specifically, the amount of intermixing between the films was observed by measuring the pattern widths after lapses of 10 seconds, 20 seconds and 30 seconds, respectively. Here, ADI, ASI and AAI are the same as those of the comparative example 1.

The results are shown in the following table 1.

TABLE 1

|  | Pattern width (ASI)(nm) | Film thickness (ASI)(nm) | Film thickness (AAI)(nm) |
| --- | --- | --- | --- |
| ADI | 40 | 95 | — |
| Neglected for 0 second | 38 | 93 | 77 |
| Neglected for 10 seconds | 39 | 95 | 83 |
| Neglected for 20 seconds | 40 | 94 | 85 |
| Neglected for 30 seconds | 41 | 94 | 87 |

The above results showed that there was no significant change in the pattern width W as neglected time goes by after the oxide coating. This notes that the amount of intermixing between the photoresist pattern and the coated oxide thereon is irrelevant to the neglected time after the coating.

EXPERIMENTAL EXAMPLE 2

The experimental example 2 shows a relationship between a baking temperature and the amount of intermixing between the films after the oxide coating.

At this time, the baking temperature was varied from 30° C. to 100° C. at intervals of 10° C., and a constant baking time of 30 seconds was given.

The results are shown in the following table 2.

TABLE 2

| Baking temperature | ADI & ASI | AAI | |
| --- | --- | --- | --- |
| (° C.) | Pattern width (nm) | SOX (nm) | Resist core (nm) |
| 30 | 45 | — | — |
| 40 | 46 | 16 | 25 |
| 50 | 48 | 18 | 22 |

TABLE 2-continued

| Baking temperature | ADI & ASI | AAI | |
|---|---|---|---|
| (° C.) | Pattern width (nm) | SOX (nm) | Resist core (nm) |
| 60 | 52 | 19 | 21 |
| 70 | 51 | 18 | 22 |
| 80 | 55 | 21 | 27 |
| 90 | 60 | 22 | 28 |
| 100 | 97 | 42 | 35 |

Figure 6:
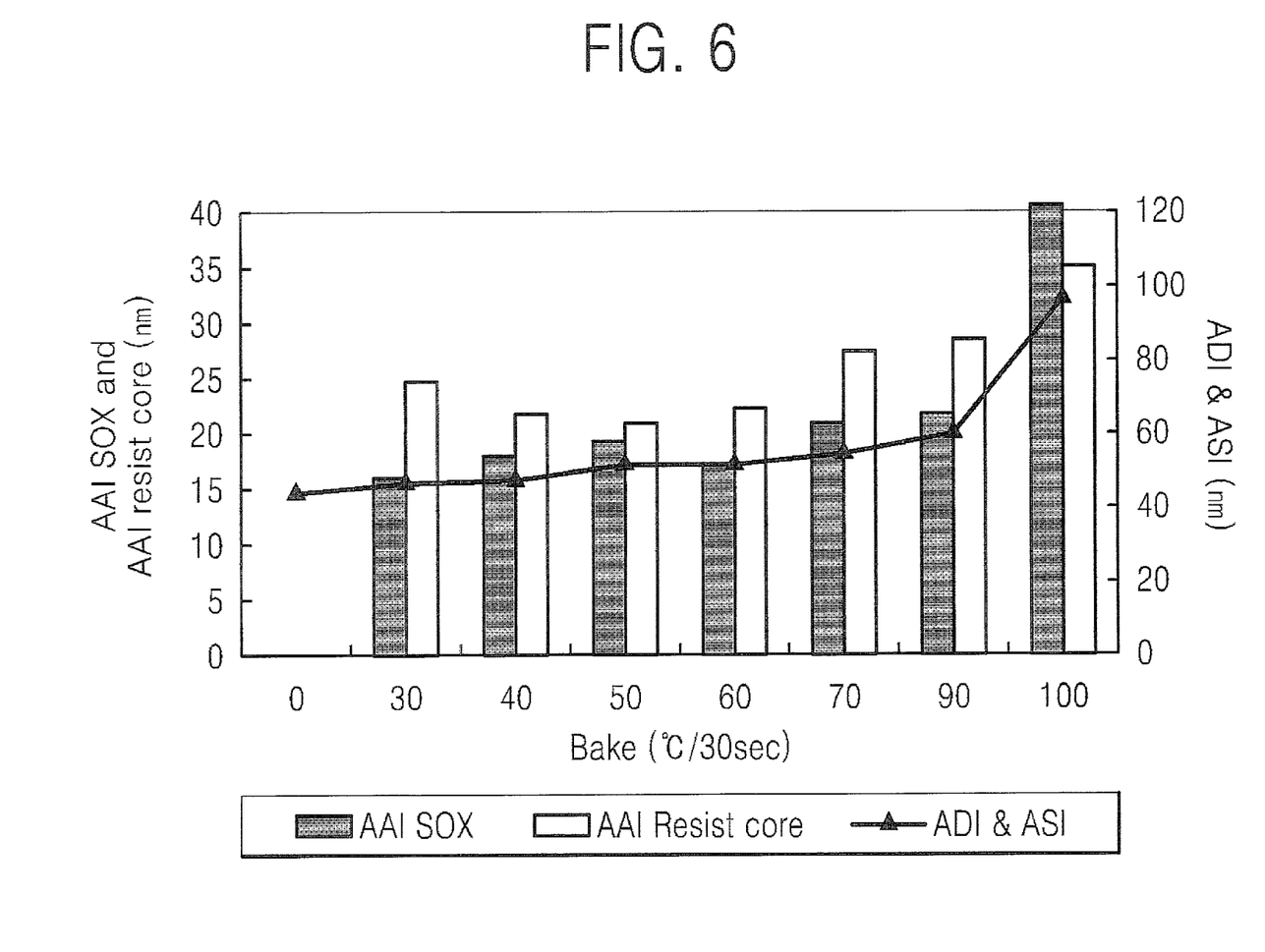
FIG. 6 is a graph showing a result in accordance with a table 2.

FIG. 6 is a graph showing the results corresponding to the table 2. Here, SOX in AAI indicates the width of the coated oxide, and Resist core indicates the width of a part where the photoresist pattern is removed by solvent or ashing.

Referring to the table 2 and FIG. 6, the pattern width is slightly increased as the baking temperature increases, and the resist core is slightly decreased up to 50° C. but a little increased at higher temperature. This results in an estimate that the intermixing between the photoresist pattern and oxide is a little increased as temperature becomes higher, and an inner reaction of oxide increases at high temperature.

However, there was no remarkable change in the amount of intermixing increased depending on the baking temperature, and it is appreciated that a major cause of the intermixing between the films is not the baking temperature.

EXPERIMENTAL EXAMPLE 3

The experimental example 3 shows a relationship between a baking time and the amount of intermixing between the films after the oxide coating.

At this time, the baking time was varied from 30 seconds to 240 seconds at intervals of 30 seconds under a constant baking temperature of 60° C.

The results are shown in the following table 3.

TABLE 3

| Baking time | ADI & ASI | AAI | |
|---|---|---|---|
| (seconds) | Pattern width (nm) | SOX (nm) | Resist core (nm) |
| ADI | 45 | — | — |
| 30 | 51 | 18 | 22 |
| 60 | 56 | 21 | 22 |
| 90 | 62 | 25 | 32 |
| 120 | 68 | 28 | 35 |
| 150 | 70 | 25 | 33 |
| 180 | 77 | 28 | 37 |
| 210 | 87 | 42 | 35 |
| 240 | 97 | 42 | 35 |

Figure 7:
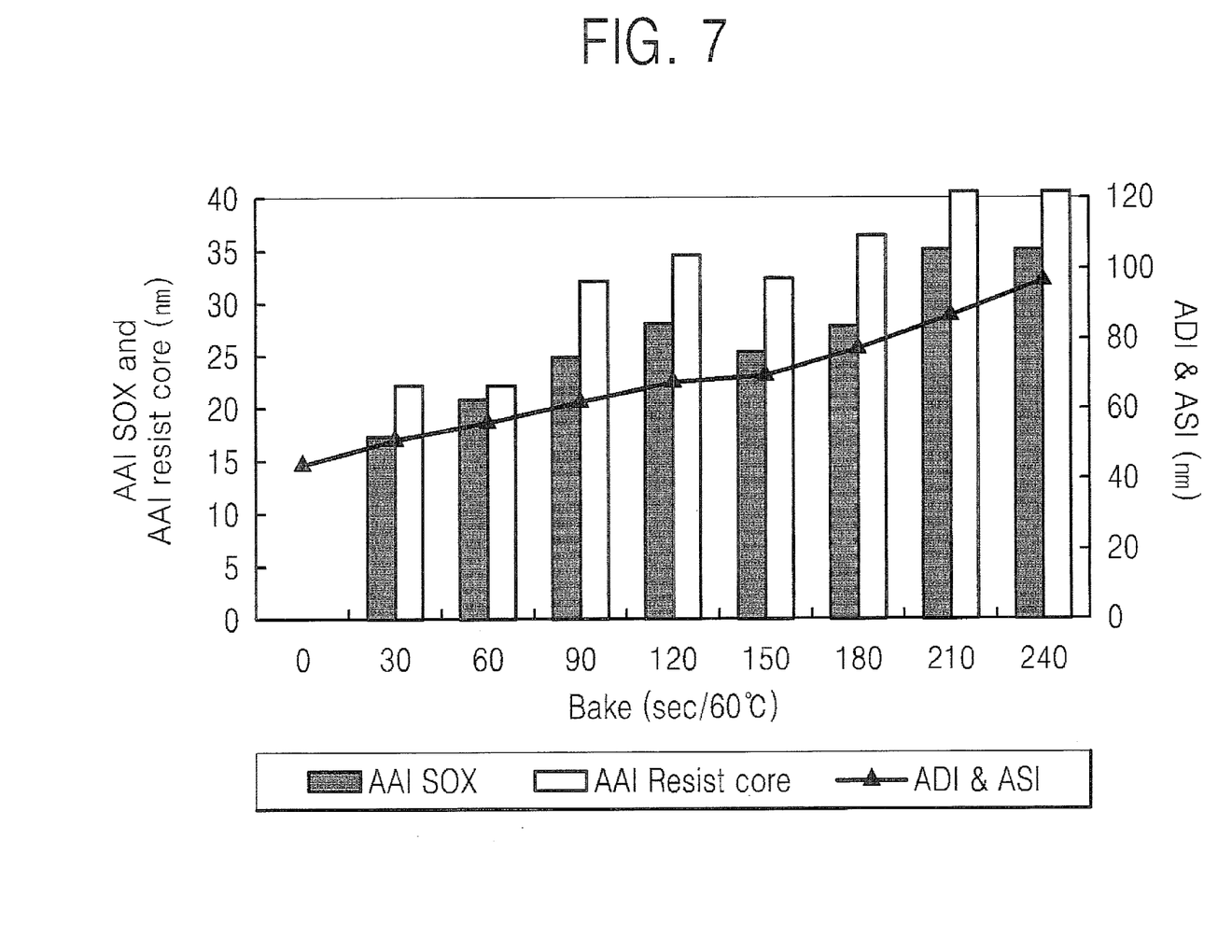
FIG. 7 is a graph showing a result in accordance with a table 3.

FIG. 7 is a graph showing the results corresponding to the table 3. Here, SOX and Resist core in AAI indicates the same as those of FIG. 6.

Referring to the table 3 and FIG. 7, as the baking time elapses, the pattern width of ASI after coating, baking and developing oxide, and the pattern width after removing by solvent or ashing the photoresist pattern are a little increased. Also, the width of the resist core is also a little increased as the baking time increases.

However, the enlargement of the pattern and the resist core with the lapse of time was not noticeably increased, and it was understood that the cause of the intermixing was not directly related to the baking time.

According to the results from the experimental examples 1 to 3, the amount of intermixing between the films of the semiconductor device is approximately constant, and this verifies that the amount of intermixing is not directly related to the neglected time or the baking temperature and time after oxide is spin-on coated.

In other words, it will be appreciated that the intermixing between the films occurs at the same time when oxide is spin-on coated on the photoresist pattern. Accordingly, in order to minimize the intermixing, there is a need for reforming the surface of the photoresist pattern to be minimally dissolved in a solvent for oxide.

As described above, in a spin-on side wall DPT process for a semiconductor device according to the inventive concepts, a material containing a leaving group is mixed with a photoresist compound, so that a cross-linking reaction layer can be formed by heating not to be dissolved in or intermixed with an organic solvent contained in an oxide layer, thereby controlling a critical dimension (CD) of a line width of a pattern, improving productivity, and reducing equipment investment.

While some example embodiments have been particularly shown and described, it will be appreciated by those skilled in the art that variations in form and detail may be made therein without departing from the spirit and scope of the claims.

What is claimed is:

1. A method to reduce intermixing between films of a double pattern technology (DPT) process, comprising:
    forming a photoresist pattern by,
        forming a photoresist layer on a structure,
            the photoresist layer including a unit including a leaving group, and
        performing a lithography process to pattern and cross-link a surface of the photoresist layer;
    spin-on coating an oxide layer on the photoresist pattern; and
    processing the oxide layer to form a plurality of oxide spacers around the photoresist pattern, wherein
    the unit including the leaving group comprises a R—NHC(O)X unit, and X corresponds to the leaving group.

2. A double pattern technology (DPT) process comprising the method according to claim 1, wherein
    the oxide layer includes silicon oxide, and
    the processing the oxide layer includes partially etching the oxide layer to form the plurality of oxide spacers, and
    the process further includes removing the photoresist pattern to form an oxide spacer pattern.

3. The process according to claim 2, wherein
    the oxide spacer pattern is on a semiconductor layer of the structure,
        the semiconductor layer is on an oxide film of the structure, and
    the process further includes,
        forming a semiconductor pattern by etching the semiconductor layer using the oxide spacer pattern as a mask, and
        forming an oxide pattern by etching the oxide film using the semiconductor pattern as a mask.

4. The method according to claim 1, wherein
    a weight ratio of the unit including the leaving group is 5 wt % to 20 wt % with respect to a total weight of the photoresist layer.

5. The method according to claim 1, wherein the leaving group (—X) includes a tertiary butyl group.

6. The method according to claim 1, wherein
    the forming the photoresist pattern includes exposing and heating the photoresist layer.

7. The method according to claim 6, wherein
    the exposing includes de-blocking a protecting group of the photoresist layer,
    the heating includes removing the leaving group, and the forming the photoresist pattern includes cross-linking a surface of the photoresist layer.

8. The method of claim 6, wherein
the heating includes removing the leaving group.

9. The method of claim 6, wherein
the exposing includes de-blocking a protecting group of the photoresist layer.

10. The method according to claim 6, wherein
the heating includes a temperature range from 140° C. to 190° C.

11. A semiconductor device comprising:
a structure;
a photoresist pattern on the structure,
the photoresist pattern including a cross-linked layer covering a photoresist layer,
the photoresist layer including a unit including a leaving group,
the unit including the leaving group including a R—NHC(O)X unit, X being the leaving group; and
a plurality of oxide spacers surrounding the photoresist pattern on the structure.

12. A patterning process comprising:
forming a photoresist pattern on a structure,
the forming the photoresist pattern including coating a resin on the structure,
the resin including a unit including a leaving group,
the unit including the leaving group including a R—NHC(O)X unit where X corresponds to the leaving group,
the photoresist pattern including a cross-linked surface that is insoluble in an organic solvent;
spin-on coating a dielectric layer on the photoresist pattern;
partially removing the dielectric layer to form a plurality of dielectric spacers surrounding the photoresist pattern; and
removing the photoresist pattern.

13. The patterning process of claim 12, wherein the forming a photoresist pattern includes:
exposing the resin,
heating the resin, and
removing a portion of the resin.

14. The patterning process of claim 12,
wherein the resin is represented by the following Chemical Formula 1,

[Chemical Formula 1]

PG is a protecting group configured to de-block upon exposure to UV lithography, and
X is the leaving group.

15. The patterning process of claim 14, wherein
the leaving group X includes a tertiary butyl group.

16. The patterning process of claim 14, wherein
a unit including the leaving group of the resin is about 5 wt % to 20 wt % of a total weight of the resin.

17. The patterning process of claim 12, wherein
the structure includes,
a substrate,
a semiconductor layer on the substrate, and
a BARC layer on the semiconductor layer, and
the forming the photoresist pattern includes patterning a resist layer on the BARC layer.

18. The patterning process of claim 17, wherein
the partially removing dielectric layer includes partially removing the BARC layer.

19. The patterning process of claim 17, further comprising:
etching the semiconductor layer after removing the photoresist pattern.

* * * * *